(12) United States Patent
Wang et al.

(10) Patent No.: US 6,717,052 B2
(45) Date of Patent: Apr. 6, 2004

(54) HOUSING STRUCTURE WITH MULTIPLE SEALING LAYERS

(75) Inventors: Ping-Song Wang, Taipei Hsien (TW); Lai-Cheng Chen, Hsinchu (TW); Wen-Tsang Liu, Taipei (TW)

(73) Assignee: Delta Optoelectronics, Inc. (TW)

( * ) Notice: Subject to any disclaimer, the term of this patent is extended or adjusted under 35 U.S.C. 154(b) by 60 days.

(21) Appl. No.: 10/157,933

(22) Filed: May 31, 2002

(65) Prior Publication Data
US 2003/0122476 A1 Jul. 3, 2003

(30) Foreign Application Priority Data

Dec. 28, 2001 (TW) ........................................ 90133020 A

(51) Int. Cl.[7] ................................................. H05K 5/06
(52) U.S. Cl. ...................................... 174/52.3; 313/512
(58) Field of Search ............................... 174/52.2, 52.4, 174/52.3; 313/512

(56) References Cited

U.S. PATENT DOCUMENTS 3,906,283 A * 9/1975 Bard et al. .................. 313/483
6,551,724 B2 * 4/2003 Ishii et al. ................... 428/690
2002/0145128 A1 * 10/2002 Sakaguchi ................. 252/181.3
2002/0187361 A1 * 12/2002 Amon ......................... 428/516

FOREIGN PATENT DOCUMENTS

| JP | 354272 | * | 12/1999 |
| JP | 243555 | * | 9/2000 |
| JP | 260562 | * | 9/2000 |
| JP | 143865 | * | 5/2001 |
| JP | 230072 | * | 8/2001 |

* cited by examiner

Primary Examiner—Hung V. Ngo
(74) Attorney, Agent, or Firm—Birch, Stewart, Kolasch & Birch, LLP

(57) ABSTRACT

A housing structure used for a display device. A transparent substrate is provided with a completed luminescent device. The rim of the transparent substrate is bonded to the rim of a sealing cap to form an airtight space. A sealing structure with a first sealing layer and a second sealing layer is provided on the bonding rim between the sealing cap and the transparent substrate. The materials used to form the first sealing layer and the second sealing layer are different.

28 Claims, 6 Drawing Sheets

HOUSING STRUCTURE WITH MULTIPLE SEALING LAYERS

BACKGROUND OF THE INVENTION

1. Field of the Invention

The present invention relates to a housing structure and a housing process for a display device and, more particularly, to a housing structure with multiple sealing layers for an organic EL element device.

2. Description of the Related Art

In an electro-luminescence (EL) element used for a display device, electric current applied to specific fluorescence or phosphorus can transform electricity into luminosity. According to the different materials used in the luminescent layer, EL elements are classified as organic and inorganic, wherein the organic EL element device employs laminated organic layers and has the advantages of thin profile, light weight, high luminescent efficiency, and low driving voltage. However, since the active lifetime and reliability is highly concerned with the housing structure, it is importance to develop an improved housing process for the organic EL element device.

Presently, the organic EL element uses active metal of low work function to form a metallic cathode, thus the active lifetime of the organic EL element is highly concerned with moisture and oxygen present in the organic EL element. As the duration of use increases, the likelihood of moisture and oxygen permeating the organic EL element also increases, causing detachment between the organic luminescent layer and the cathode, cracking of the organic materials, and oxidation of the electrodes. As a result, a so-called 'dark spot', to which electricity is not supplied, is generated, decreasing luminescence and luminescent uniformity. In order to prolong the active lifetime, various technologies of reducing the interior humidity, to solve the problem of the dark spot, have been developed, such as forming photo-hardened resin on the glass substrate, plating metal oxide, fluoride or sulfide on the glass substrate, forming a water-resistant film on the glass substrate, and using an airtight case to package the organic EL element. Nevertheless, other problems, such as leakage current, crosstalk and oxide dissolution, remain to be solved.

FIG. 1 is a sectional diagram showing a first housing structure for an organic EL element 10 according to the prior art. An organic EL element 10 comprises a glass substrate 12, a lamination body 14 formed by an anode layer 11, an organic luminescent material layer 13 and a cathode layer 15, and a sealing agent 16 covering the lamination body 14. In housing process, a sealing cap 18 is fixed over the glass substrate 12, and then the sealing cap 18 is pressed on the sealing agent 16 by a uniform pressure and the sealing agent 16 is cured by heating. However, the thermal curing must proceed in a specific atmosphere in which moisture and oxygen are severely controlled and requires a long heating time, therefore this housing process cannot satisfy the demands of mass production.

FIG. 2 is a sectional diagram showing a second housing structure for an organic EL element 20 according to the prior art. The second housing structure provides a sealing agent 24 on the rim of the glass substrate 12 to bond the sealing cap 18 and the glass substrate 12, resulting in an airtight space 22. The sealing agent 24 is UV-cured resin that can be cured by UV irradiation to reduce the housing process time. Nevertheless, the UV-cured resin is epoxy resin containing a large amount of moisture and presenting outgassing, therefore the single-layered sealing agent 24 cannot provide good water/oxygen-resistance for the organic EL element 20.

FIG. 3A is a top view showing a metallic cap of a third housing structure for an organic EL element 30 according to the prior art, and FIG. 3B is a sectional diagram showing a third housing structure for an organic EL element 30 according to the prior art. The third housing structure provides a stamping-form metallic cap 32 which has a concavity facing the lamination body 14, a water-absorbentable layer 34 disposed in the cavity and an unidirectional penetrating film 36 covering the water-absorbentable layer 34. Preferably, the water-absorbentable layer 34 is of solid-state compounds, such as BaO, CaO, CaSO4 and $CaCl_2$ for absorbing moisture and maintaining a solid state. Also, the moisture absorbed by the layer 34 can stay in the cavity without flowing from the unidirectional penetrating film 36. This housing structure could pass the strict circumstance test, but the metallic cap 32 without a planar surface decreases the efficacy of water/oxygen-resistance ability, and causes difficulties in manufacturing a larger-size organic EL element device. In addition, since the thickness of the metallic cap 32 is greater than that of the glass substrate 12, the organic EL device element 30 cannot achieve the aims of light weight, thin thickness, short measure and small size for planar display market.

SUMMARY OF THE INVENTION

The present invention provides a housing structure and a housing process to solve the problems found in the prior art. A transparent substrate is provided with a completed luminescent device. The rim of the transparent substrate is bonded to the rim of a sealing cap to form an airtight space. A sealing structure with a first sealing layer and a second sealing layer is provided on the bonding rim between the sealing cap and the transparent substrate. The materials used to form the first sealing layer and the second sealing layer are different.

Accordingly, it is a principal object of the invention to provide a housing structure to prolong active lifetime of display device.

It is another object of the invention to provide a housing structure to improve resistance to moisture and oxygen.

Yet another object of the invention is to provide a housing structure to improve adhesion.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention provides a housing structure with multiple sealing layers for organic/inorganic EL element device, such as OLED, PLED, LCD, PDP, and other light diode. In the housing structure, at least two sealing layers are selectively coated in the interior space or on the rim of the EL element, or seal the EL element. Also, the housing structure provides rib structures, gaseous protective layers, and water-resistant films to further prolong the active lifetime of the EL element device.

[First Embodiment]

The first embodiment provides a housing structure with dual sealing layers of two different materials to achieve repulsion of water, resistance to water, great absorption of moisture/oxygen and high adhesive strength at the same time. Compared with the single sealing layer in the prior art, the combined characteristics provided by the dual sealing layer ensure luminescent performance and active lifetime of the organic EL element device. In addition, according to process requirements, more than two sealing layers can be formed to enhance the resistance to moisture and oxygen.

Figure 1:
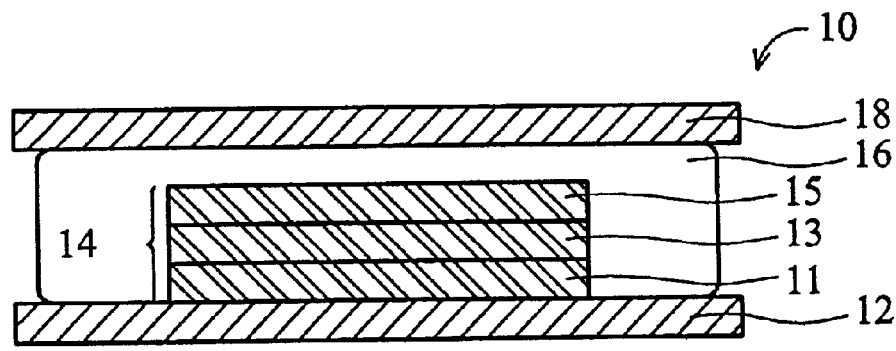
FIG. 1 is a sectional diagram showing a first housing structure for an organic EL element according to the prior art.
Figure 2:
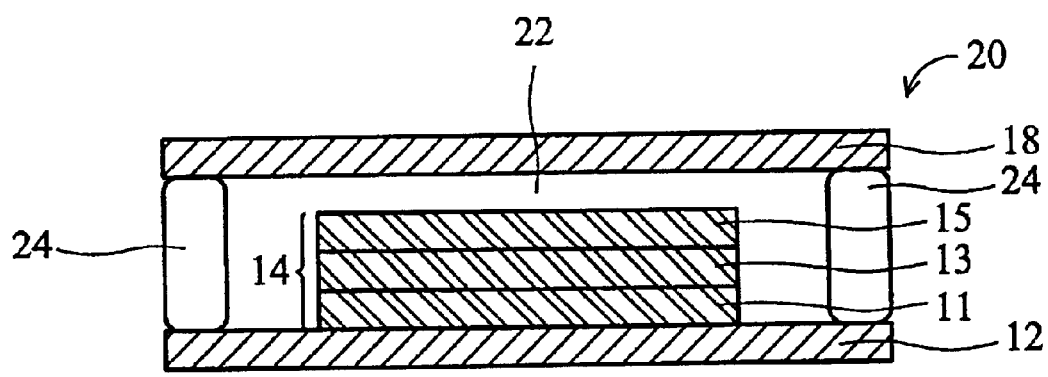
FIG. 2 is a sectional diagram showing a second housing structure for an organic EL element according to the prior art.
Figure 3A:
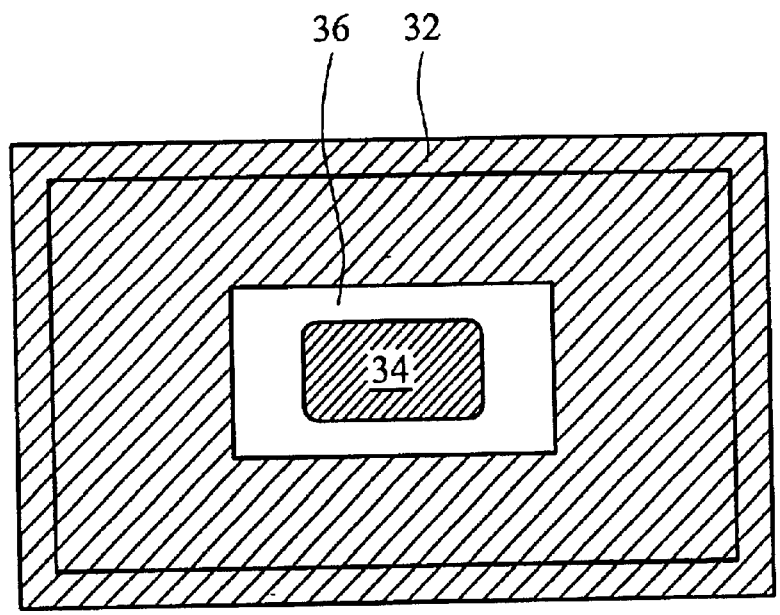
FIG. 3A is a top view showing a metallic cap of a third housing structure for an organic EL element 30 according to the prior art.
Figure 3B:
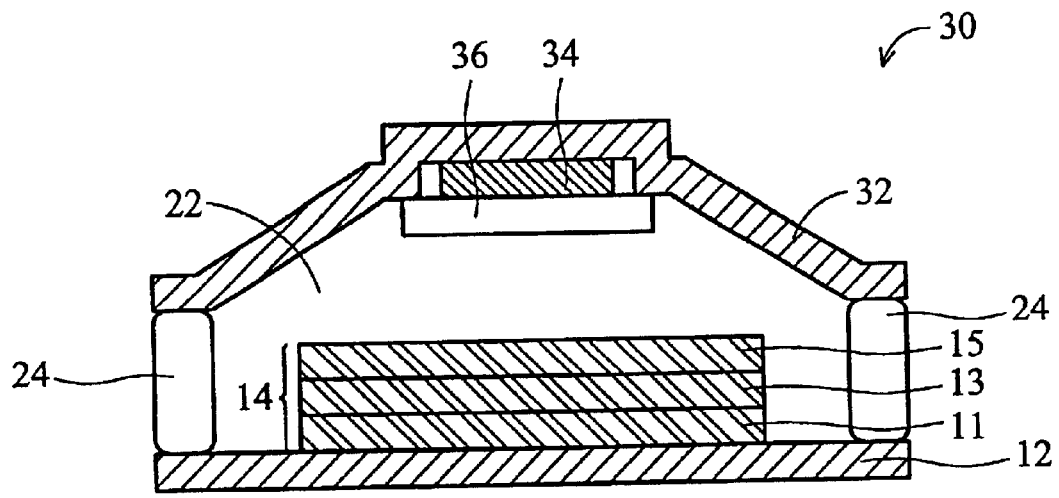
FIG. 3B is a sectional diagram showing a third housing structure for an organic EL element according to the prior art.
Figure 4A:
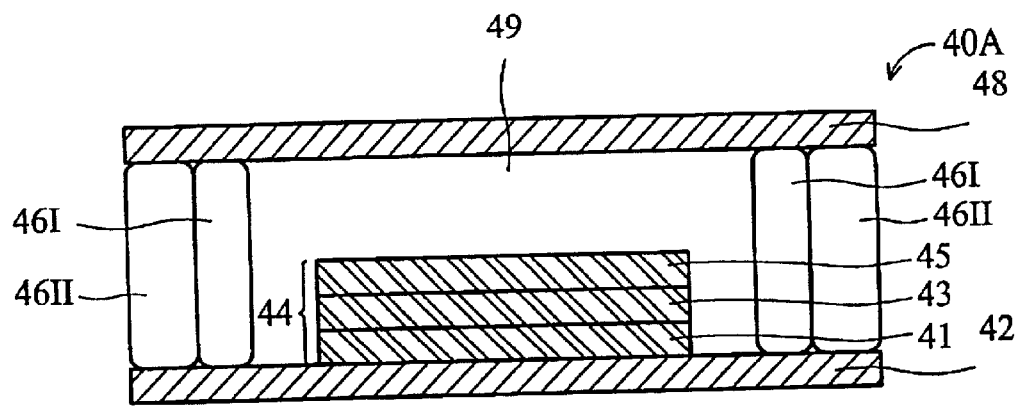
FIG. 4A is a sectional diagram showing a first housing structure according to the first embodiment of the present invention.

FIG. 4A is a sectional diagram showing a first housing structure according to the first embodiment of the present invention. For an organic EL element 40A, on a transparent substrate 42 of glass, transparent plastic or polymer, an anode layer 41, an organic luminescent layer 43 and a cathode layer 45 form a lamination body 44. In housing process, a first sealing layer 46I and a second sealing layer 46II are coated on the rim of a sealing cap 48 to serve as dual loops. Preferably, the sealing cap 48 is of glass, metal or ceramic material. Then, the sealing cap 48 is fixed over the transparent substrate 42 and uniformly pressed on the sealing layers 46I and 46II. Finally, the first sealing layer 46I and the second sealing layer 46II are respectively cured by appropriate curing treatments, thus the rim of the sealing cap 48 is bonded to the rim of the transparent substrate 42 to form an airtight space 49.

The first sealing layer 46I and the second sealing layer 46II are formed by different materials, such as ceramic, polymer, metal or composite, in which water/oxygen-absorbable substances of solid, liquid or gaseous body can be selectively mixed to stop water/oxygen permeation and provide adequate adhesion. As well, depending on selected curing processes, the material used to form the first sealing layer 46I or the second sealing layer 46II can be a room-temperature curing type, a heating curing type, a UV curing type or a visible-light curing type. Thus, during curing process, the curing source is selected from illuminant irradiation or thermal heating to reduce housing process time. For example, if the first sealing layer 46I is light-cured and the second sealing layer 46II is heat-cured, an UV illuminant or other appropriate light source is first used to rapidly cure the first sealing layer 46I, and then a heating process is used in an ordinary-level clean circumstance to cure the second sealing layer 46II.

Figure 4B:
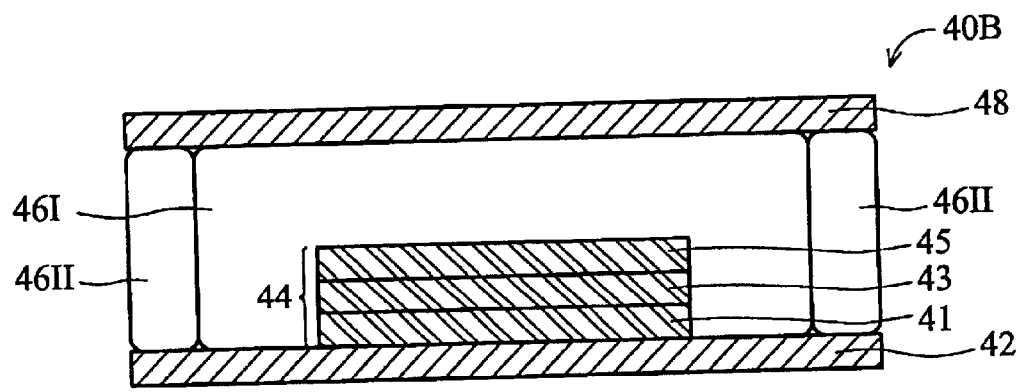
FIG. 4B is a sectional diagram showing a second housing structure according to the first embodiment of the present invention.

FIG. 4B is a sectional diagram showing a second housing structure according to the first embodiment of the present invention. For an organic EL element 40B, the first sealing layer 46I of large size is coated on the sealing cap 48 in position corresponding to the luminescent area, and the second sealing layer 46II is coated on the rim of the sealing cap 48. Then, the above-described steps of orientation, uniform pressure, and curing treatment complete the housing process. The material, curing type and curing process used for the first sealing layer 46I and the second sealing layer 46II are the same as the forecited conditions.

Compared with the first housing structure shown in FIG. 4A, the second housing structure uses the first sealing layer 46I to wrap the luminescent area to increase the housing area between the sealing cap 48 and the transparent substrate 42, resulting in a greater mechanical strength of the organic EL element 40B. Also, the increased housing area provides a longer distance for moisture/oxygen permeation to further increase the active lifetime of the organic EL element 40B. Furthermore, in another method of forming the first sealing layer 46I, immersion, evaporation, chemical vapor deposition or sputtering is used to wrap the luminescent area on the transparent substrate 42. Then, the second sealing layer 46II is coated on the rim of the transparent substrate 42 or the sealing cap 48. Thereafter, the above-described steps of orientation, uniform pressure, and curing treatment complete the housing process.

[Second Embodiment]

The second embodiment provides the organic EL element 40B (shown in FIG. 4B) with a rib structure around the luminescent area to prevent moisture/oxygen permeation and decrease moisture/oxygen permeable area. Thus, combining the dense nature of the rib structure and the moisture/oxygen resistance of the dual sealing layers can further improve the active lifetime of the organic EL element device.

Figure 5A:
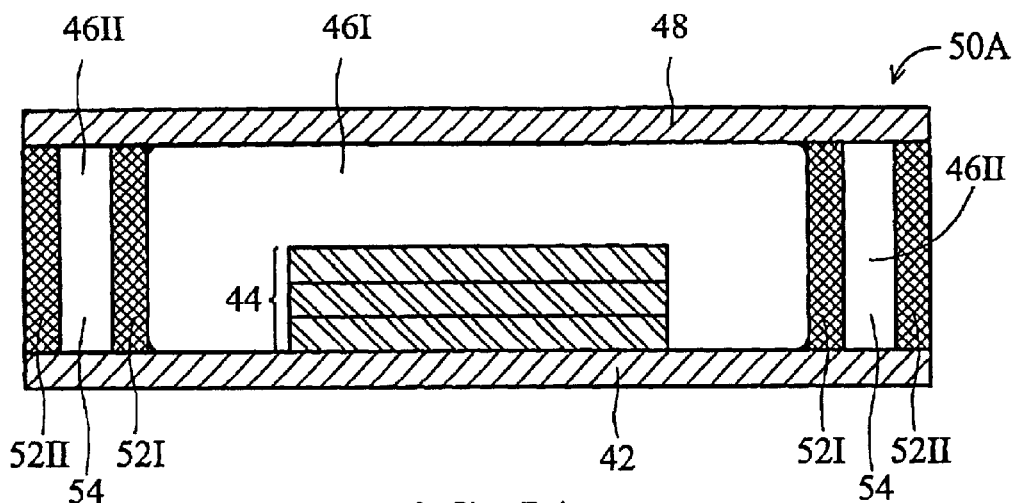
FIG. 5A is a sectional diagram showing a first housing structure according to the second embodiment of the present invention.

FIG. 5A is a sectional diagram showing a first housing structure according to the second embodiment of the present invention. For an organic EL element 50A, a rib structure with single loop or dual loops is formed on the rim of the sealing cap 48. Preferably, a rib structure with dual loops is shown as a first rib 52I and a second rib 52II formed by glass, ceramic, metal, organic polymer or composite. Then, the first sealing layer 46I is coated on the sealing cap 48 in position corresponding to the luminescent area. Next, the second sealing layer 46II is coated in a space between the first rib 52I and the second rib 52II. Thereafter, steps of orientation, uniform press and curing treatment are used to complete the housing process. The first rib 52I and the second rib 52II provide a fixed space between the transparent substrate 42 and the sealing cap 48, thus the first sealing layer 46I and the second sealing layer 46II are uniformly distributed within the fixed space to prevent local damage from curing process.

Figure 5B:
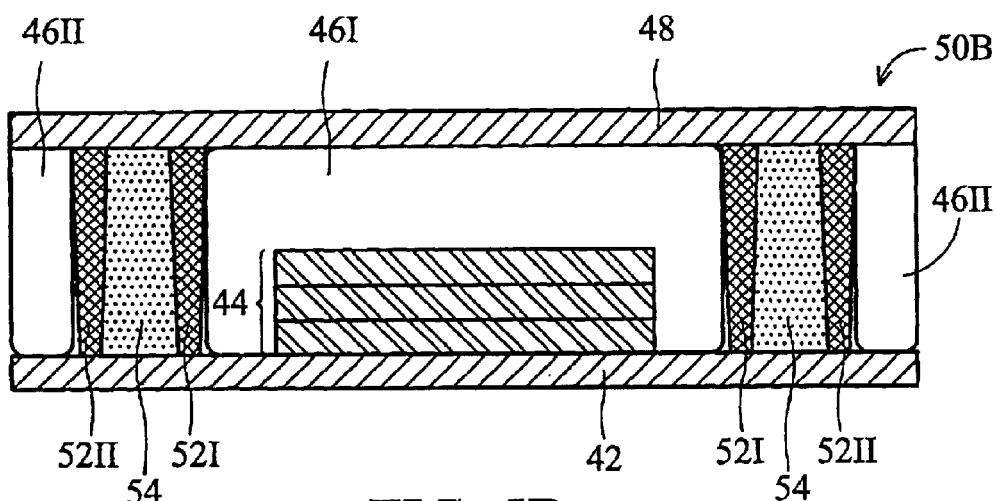
FIG. 5B is a sectional diagram showing a second housing structure according to the second embodiment of the present invention.

FIG. 5B is a sectional diagram showing a second housing structure according to the second embodiment of the present invention. Unlike the first housing structure, in an organic EL element 50B, the second sealing layer 46II is coated outside the second rib 52II and a water-absorbentable layer 54 is coated in the space between the first rib 52I and the second rib 52II. The water-absorbent layer 54 comprises BaO, CaO, CaSO$_4$, and CaCl$_2$ that form solid state, liquid state or a film for absorbing moisture. Since the water-absorbentable layer 54 has a high activation nature the same as moisture, the water-absorbentable layer 54 can chemically react with outer moisture to stop the outer moisture permeating the housing structure.

Figure 5C:
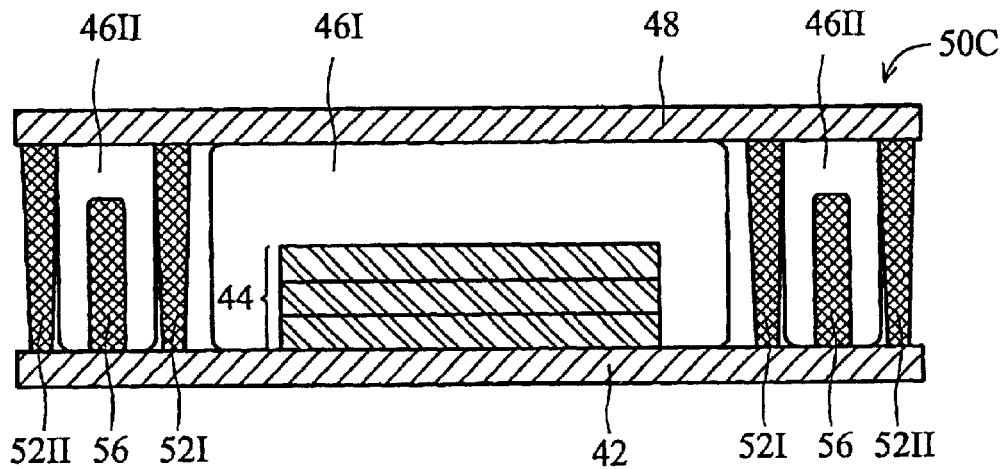
FIG. 5C is a sectional diagram showing a third housing structure according to the second embodiment of the present invention.

FIG. 5C is a sectional diagram showing a third housing structure according to the second embodiment of the present invention. Unlike the first housing structure, in an organic EL element 50C, a third rib 56 is formed on the rim of the transparent substrate 42 and disposed between the first rib 52I and the second rib 52II. Therefore, the second sealing layer 46II is coated in a space between the first rib 52I and the third rib 56, and in a space between the second rib 52II and the third rib 56.

[Third Embodiment]

The third embodiment provides the organic EL element 40A (shown in FIG. 4A) with a gaseous protective layer to increase elasticity and strength which prevents the sealing layers from being squeezed caused by the appearance of increased pressure generated by pressurization or heating. This ensures the practicability of the sealing layers.

Figure 6A:
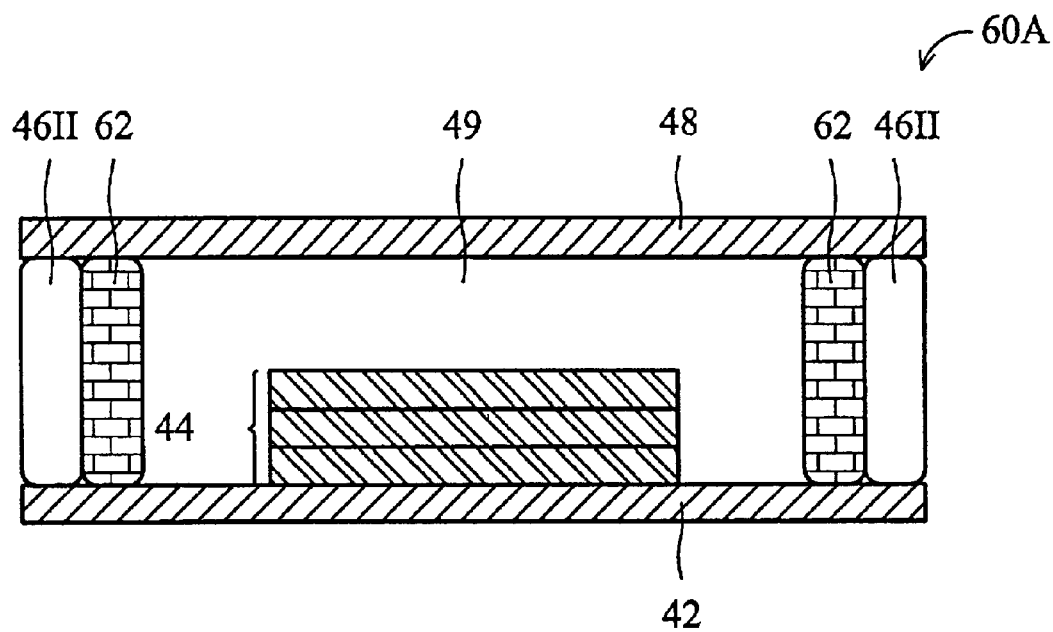
FIG. 6A is a sectional diagram showing a first housing structure according to the third embodiment of the present invention.

FIG. 6A is a sectional diagram showing a first housing structure according to the third embodiment of the present invention. Compared with the organic EL element 40A shown in FIG. 4A, in an organic EL element 60A of the third embodiment, the first sealing layer 46I is replaced by a gaseous protective layer 62 of rubber, silica gel or other elastic materials. In housing process, the gaseous protective layer 62 is formed on the rim of the sealing cap 48, and then the second sealing layer 46II is formed outside the gaseous protective layer 62 on the sealing cap 48. Thereafter, steps of orientation, uniform pressure and curing treatment are used to complete the housing process.

Figure 6B:
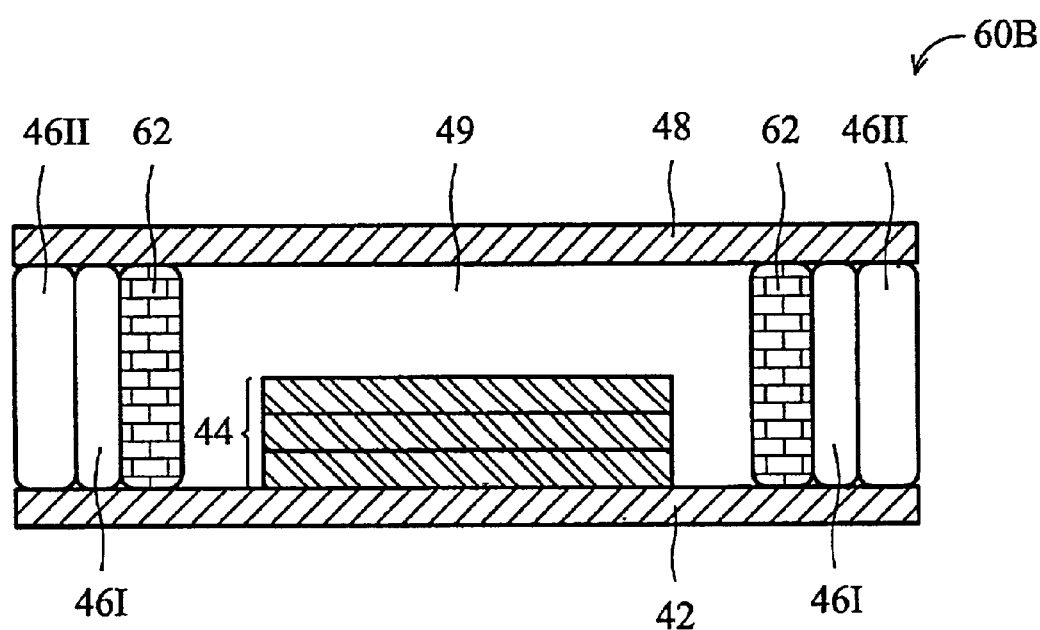
FIG. 6B is a sectional diagram showing a second housing structure according to the third embodiment of the present invention.

FIG. 6B is a sectional diagram showing a second housing structure according to the third embodiment of the present invention. Compared with the organic EL element 40A shown in FIG. 4A, in an organic EL element 60B of the third embodiment, the gaseous protective layer 62 is formed on the rim of the sealing cap 48, and then the first sealing layer 46I and the second sealing layer 46II are sequentially formed outside the gaseous protective layer 62 on the sealing cap 48. Thereafter, steps of orientation, uniform press and curing treatment are used to complete the housing process.

[Fourth Embodiment]

The fourth embodiment provides a water-resistant film on the exterior surface of the completed housing structure described in the first, second and third embodiments. The water-resistant film has hydrophobic nature to decrease the moisture/oxygen permeation.

Figure 7A:
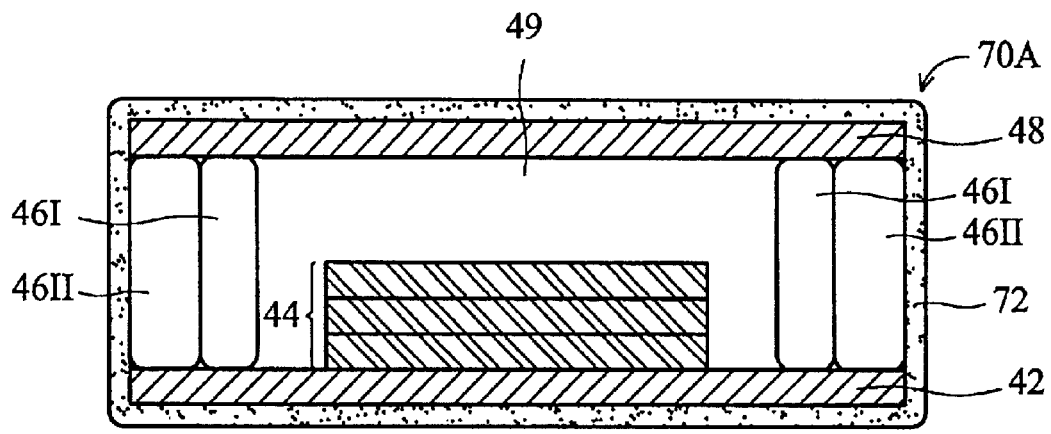
FIGS. 7A and 7B are sectional diagrams showing housing structures according to the fourth embodiment.
Figure 7B:
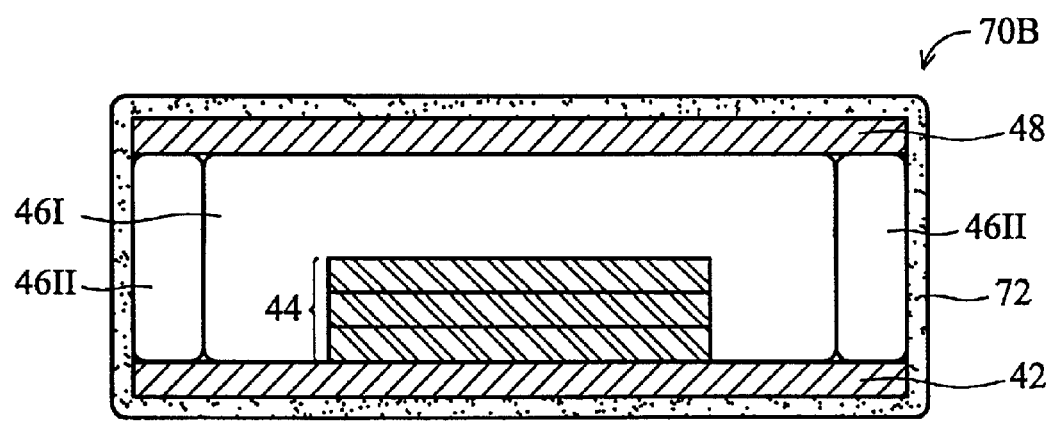

FIGS. 7A and 7B are sectional diagrams showing housing structures according to the fourth embodiment. As shown in FIG. 7A, in an organic EL element 70A, a transparent water-resistant film 72 is formed using immersion, evaporation, chemical vapor deposition or sputtering to wrap the completed housing structure shown in FIG. 4A. As shown in FIG. 7B, in an organic EL element 70B, a transparent water-resistant film 72 is formed using immersion, evaporation, chemical vapor deposition or sputtering to wrap the completed housing structure shown in FIG. 4B.

It is to be understood that the present invention is not limited to the embodiments described above, but encompasses any and all embodiments within the scope of the following claims.

What is claimed is:

1. A housing structure for a display device, comprising:
   a transparent substrate on which a luminescent device is completed;
   a sealing cap, wherein the rim of the sealing cap is bonded to the rim of the transparent substrate to form an airtight space; and
   a sealing structure formed surrounding the luminescent device and on the bonding rim between the sealing cap and the transparent substrate, the sealing structure at least comprising a first sealing layer and a second sealing layer, wherein the second sealing layer surrounds the first sealing layer and the materials used to form the first sealing layer and the second sealing layer are different.

2. The housing structure according to claim 1, wherein the display device is an organic display device or inorganic display device.

3. The housing structure according to claim 1, wherein the display device is and organic EL element device, polymer EL element device, liquid crystal display, plasma display panel or other luminescent display.

4. The housing structure according to claim 1, wherein the transparent substrate is glass, transparent plastic or polymer.

5. The housing structure according to claim 1, wherein the sealing cap is glass, metal or ceramic.

6. The housing structure according to claim 1, wherein the luminescent device is a lamination body comprising an anode layer, an organic luminescent layer and a cathode layer.

7. The housing structure according to claim 1, wherein the material used to form the first sealing layer is ceramic, polymer, metal or composite, is mixed with substance for absorbing moisture, oxygen and other gas, and is room-temperature-cured, heat-cured, UV-cured, or visible-light-cured.

8. The housing structure according to claim 1, wherein the material used to form the second sealing layer is ceramic, polymer, metal or composite, is mixed with substance for absorbing moisture, oxygen and other gas, and is room-temperature-cured, heat-cured, UV-cured, or visible-light-cured.

9. The housing structure according to claim 1, wherein the first sealing layer is a gaseous protective body with elasticity.

10. The housing structure according to claim 1, further comprising a gaseous protective layer body surrounded by the first sealing layer.

11. The housing structure according to claim 1, further comprising a transparent water-resistant film coated on the exterior surface of the housing structure.

12. A housing structure for a display device, comprising:
    a transparent substrate on which a luminescent device is completed;
    a sealing cap, wherein the rim of the sealing cap is bonded to the rim of the transparent substrate to form an airtight space; and
    a first sealing layer formed within the airtight space to wrap the luminescent device; and
    a second sealing layer surrounding the luminescent device and disposed on the bonding rim between the sealing cap and the transparent substrate;

wherein, the materials used to form the first sealing layer and the second sealing layer are different.

13. The housing structure according to claim 12, wherein the display device is an organic display device or inorganic display device.

14. The housing structure according to claim 12, wherein the display device is an organic EL element device, polymer EL element device, liquid crystal display, plasma display panel or other luminescent display.

15. The housing structure according to claim 12, wherein the transparent substrate is glass, transparent plastic or polymer.

16. The housing structure according to claim 12, wherein the sealing cap is glass, metal or ceramic.

17. The housing structure according to claim 12, wherein the luminescent device is a lamination body comprising an anode layer, an organic luminescent layer and a cathode layer.

18. The housing structure according to claim 12, wherein the material used to form the first sealing layer is ceramic, polymer, metal or composite, is mixed with substance for absorbing moisture, oxygen and other gas, and is room-temperature-cured, heat-cured, UV-cured, or visible-light-cured.

19. The housing structure according to claim 12, wherein the material used to form the second sealing layer is ceramic, polymer, metal or composite, mixed with substance for absorbing moisture, oxygen and other gas, and is room-temperature-cured, heat-cured, UV-cured, or visible-light-cured.

20. The housing structure according to claim 12, further comprising a transparent water-resistant film coated on the exterior surface of the housing structure.

21. The housing structure according to claim 12, further comprising:

a first rib formed between the first sealing layer and the second sealing layer;

a second rib surrounding the second sealing layer and disposed on the bonding rim between the sealing cap and the transparent substrate.

22. The housing structure according to claim 21, wherein the first rib and the second rib are glass, ceramic, metal, organic polymer or composite.

23. The housing structure according to claim 12, further comprising:

a first rib formed between the first sealing layer and the second sealing layer;

a second rib formed between the first rib and the second sealing layer; and a water absorbing layer formed between the first rib and the second rib.

24. The housing structure according to claim 23, wherein the first rib and the second rib are glass, ceramic, metal, organic polymer or composite.

25. The housing structure according to claim 23, wherein the water absorbing layer is solid, liquid or gas.

26. The housing structure according to claim 12, further comprising:

a first rib formed between the first sealing layer and the second sealing layer;

a second rib surrounding the second sealing layer; and a third rib formed between the first rib and the second rib, wherein the second sealing layer fills the space between the first rib and the third rib and the space between the second rib and the third rib.

27. The housing structure according to claim 26, wherein the first rib, the second rib and the third rib are glass, ceramic, metal, organic polymer or composite.

28. The housing structure according to claim 26, wherein the first rib and the second rib are formed on the sealing cap, and the third rib is formed on the transparent substrate.

* * * * *